(12) United States Patent
Oh et al.

(10) Patent No.: US 12,224,553 B2
(45) Date of Patent: Feb. 11, 2025

(54) LASER DIODE AND MANUFACTURING METHOD OF THE SAME

(71) Applicant: ELECTRONICS AND TELECOMMUNICATIONS RESEARCH INSTITUTE, Daejeon (KR)

(72) Inventors: Su Hwan Oh, Daejeon (KR); Oh Kee Kwon, Sejong-si (KR); Chul-Wook Lee, Daejeon (KR); Kisoo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 678 days.

(21) Appl. No.: 17/561,212

(22) Filed: Dec. 23, 2021

(65) Prior Publication Data
US 2022/0255291 A1    Aug. 11, 2022

(30) Foreign Application Priority Data

Feb. 9, 2021   (KR) .................. 10-2021-0018253

(51) Int. Cl.
| H01S 5/024 | (2006.01) |
| H01S 5/02 | (2006.01) |
| H01S 5/026 | (2006.01) |
| H01S 5/0625 | (2006.01) |
| H01S 5/125 | (2006.01) |

(52) U.S. Cl.
CPC ........ *H01S 5/02461* (2013.01); *H01S 5/0203* (2013.01); *H01S 5/0207* (2013.01); *H01S 5/024* (2013.01); *H01S 5/0261* (2013.01); *H01S 5/0268* (2013.01); *H01S 5/06256* (2013.01); *H01S 5/125* (2013.01)

(58) Field of Classification Search
CPC .. H01S 5/02461; H01S 5/0203; H01S 5/0207; H01S 5/024; H01S 5/0261; H01S 5/0268; H01S 5/06256; H01S 5/125
See application file for complete search history.

(56) References Cited

U.S. PATENT DOCUMENTS

| 8,422,530 B2 | 4/2013 | Yoon |
| 10,277,008 B1 | 4/2019 | An |
| 10,666,014 B2 | 5/2020 | He et al. |

(Continued)

FOREIGN PATENT DOCUMENTS

| JP | H0697601 A | 4/1994 |
| KR | 10-2017-0055902 A | 5/2017 |

OTHER PUBLICATIONS

Ximeng Han et al., "Numerical Analysis on Thermal Tuning Efficiency and Thermal Stress of a Thermally Tunable SG-DBR Laser", IEEE Photonics Journal, vol. 8, No. 3, Apr. 22, 2016.

*Primary Examiner* — Yuanda Zhang
(74) *Attorney, Agent, or Firm* — Rabin & Berdo, P.C.

(57) ABSTRACT

Provided is a laser diode and a method for manufacturing the same. The diode includes a substrate including a DBR region having a channel hole, an active region, and a phase shift region, an optical waveguide provided on the substrate and extending from the active region to the DBR region, a lower insulation layer disposed on the optical waveguide, upper electrodes disposed on the lower insulation layer, and a heat blocking layer disposed in the channel hole of the DBR region and thermally separating the optical waveguide from the substrate.

15 Claims, 11 Drawing Sheets

(56) References Cited

U.S. PATENT DOCUMENTS

| | | | | |
|---|---|---|---|---|
| 2003/0025976 | A1* | 2/2003 | Wipiejewski | G02F 1/0147 |
| | | | | 359/240 |
| 2014/0321488 | A1* | 10/2014 | Chen | H01S 5/02461 |
| | | | | 438/694 |
| 2018/0205199 | A1* | 7/2018 | Kwon | H01S 5/02461 |
| 2020/0388989 | A1* | 12/2020 | Yoon | H01S 5/04256 |

* cited by examiner

LASER DIODE AND MANUFACTURING METHOD OF THE SAME

CROSS-REFERENCE TO RELATED APPLICATIONS

This U.S. non-provisional patent application claims priority under 35 U.S.C. § 119 of Korean Patent Application No. 10-2021-0018253, filed on Feb. 9, 2021, the entire contents of which are hereby incorporated by reference.

BACKGROUND

The present disclosure herein relates to a laser diode and a method for manufacturing the same, and more particularly, to a distributed Bragg reflector laser diode and a method for manufacturing the same.

In general, a wavelength tunable laser diode may have advantages over a single-wavelength laser diode from an economical standpoint of implementing an optical communication system of a high-density wavelength division scheme (Dense WDM). For example, a wavelength tunable laser diode may include a sampled grating distributed Bragg reflector (SG-DBR) laser diode, a super-structure grating distributed Bragg reflector (SSG-DBR) laser diode, and a grating-assisted codirectional-coupler with sampled grating reflector (GCSR) laser diode. Among them, a sampled grating distributed Bragg reflector laser diode is easy to manufacture and easy to integrate with other functional elements, and thus, is currently most commercialized.

SUMMARY

The present disclosure provides a laser diode capable of thermally separating an optical waveguide from a substrate, thereby uniformly controlling the temperature of a DBR region.

An embodiment according to the inventive concept provides a laser diode. The laser diode includes a substrate including an active region, a phase shift region adjacent to the active region, and a DBR region adjacent to the phase shift region and having a channel hole, a lower clad layer disposed on the substrate, an optical waveguide disposed on the lower clad layer and extending from the active region to the DBR region, an upper clad layer disposed on the optical waveguide and the lower clad layer, a lower insulation layer disposed on the lower clad layer, the upper clad layer, and the substrate of the phase shift region and the DBR region, an upper insulation layer disposed on the lower insulation layer, upper electrodes disposed on the upper insulation layer, and a heat blocking layer disposed between the upper insulation layer and the lower insulation layer outside the lower clad layer, the optical waveguide, and the upper clad layer, and disposed in the channel hole to thermally separate the optical waveguide from the substrate.

In an embodiment, the heat blocking layer may include benzocyclbutene (BCB), or polyimide.

In an embodiment, the heat blocking layer may have an M shape.

In an embodiment, the heat blocking layer may be disposed on both sidewalls and a lower portion of the optical waveguide.

In an embodiment, the upper clad layer may include a Bragg grating disposed in the DBR region.

In an embodiment, the lower insulation layer and the upper insulation layer may include silicon nitride.

In an embodiment, the laser diode may further include a contact electrode provided between the upper clad layer of the active region and one of the upper electrodes, and electrode pads connected to the upper electrodes.

In an embodiment, the laser diode may further include a pad insulation layer between one of the electrode pads of the active region and the substrate, wherein the pad insulation layer may include benzocyclbutene (BCB), or polyimide.

In an embodiment, the laser diode may further include a barrier layer between an inner wall of the channel hole and the heat blocking layer.

In an embodiment, the laser diode may further include a lower electrode disposed on a lower surface of the substrate of the active region.

In an embodiment according to the inventive concept, a method for manufacturing a laser diode includes forming a lower clad layer, an optical waveguide, and an upper clad layer on a substrate including an active region, a phase shift region, and a DBR region, forming a lower insulation layer on the lower clad layer, the optical waveguide, the upper clad layer, and the substrate of the DBR region, partially etching the lower insulation layer and the substrate outside the lower clad layer, the optical waveguide, and the upper clad layer of the phase shift region and the DBR region to form trenches, etching the substrate on inner walls of the trenches to form a channel hole connecting the trenches, forming a heat blocking layer inside of the channel hole and on the lower insulation layer, forming an upper insulation layer on the heat blocking layer and on the lower insulation layer, and forming upper electrodes on the upper insulation layer of the phase shift region and the DBR region, and on the upper clad layer of the active region.

In an embodiment, the method may further include forming a contact electrode on the upper clad layer of the active region.

In an embodiment, the method may further include forming a barrier layer on an inner wall of the channel hole.

In an embodiment, the trenches may be formed by a dry etching process.

In an embodiment, the channel hole may be formed by a wet etching process.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, a preferred embodiment of the inventive concept will be described in detail with reference to the accompanying drawings. Advantages and features of the inventive concept and methods of accomplishing the same may be understood more readily by reference to the following detailed description of exemplary embodiments and the accompanying drawings. However, the inventive concept is not limited to the embodiments described herein, and may be embodied in other forms. Rather, the embodiments introduced herein are provided to ensure that the disclosed contents may be thorough and complete, and that the spirit of the inventive concept may be sufficiently conveyed to those skilled in the art. The inventive concept is only defined by scopes of claims. The same reference numerals refer to like elements throughout the specification.

The terms used herein are for the purpose of describing embodiments and are not intended to be limiting of the present invention. In the present specification, singular forms include plural forms unless the context clearly indicates otherwise. As used herein, the terms "comprises" and/or "comprising" are intended to be inclusive of the stated elements, steps, operations and/or devices, and do not exclude the possibility of the presence or the addition of one or more other elements, steps, operations, and/or devices. In addition, in the specification, an optical waveguide will be understood as having the meaning mainly used in the optical communication field. Since the present specification is according to a preferred embodiment, reference numerals presented according to the order of description are not necessarily limited to the order.

Figure 1:
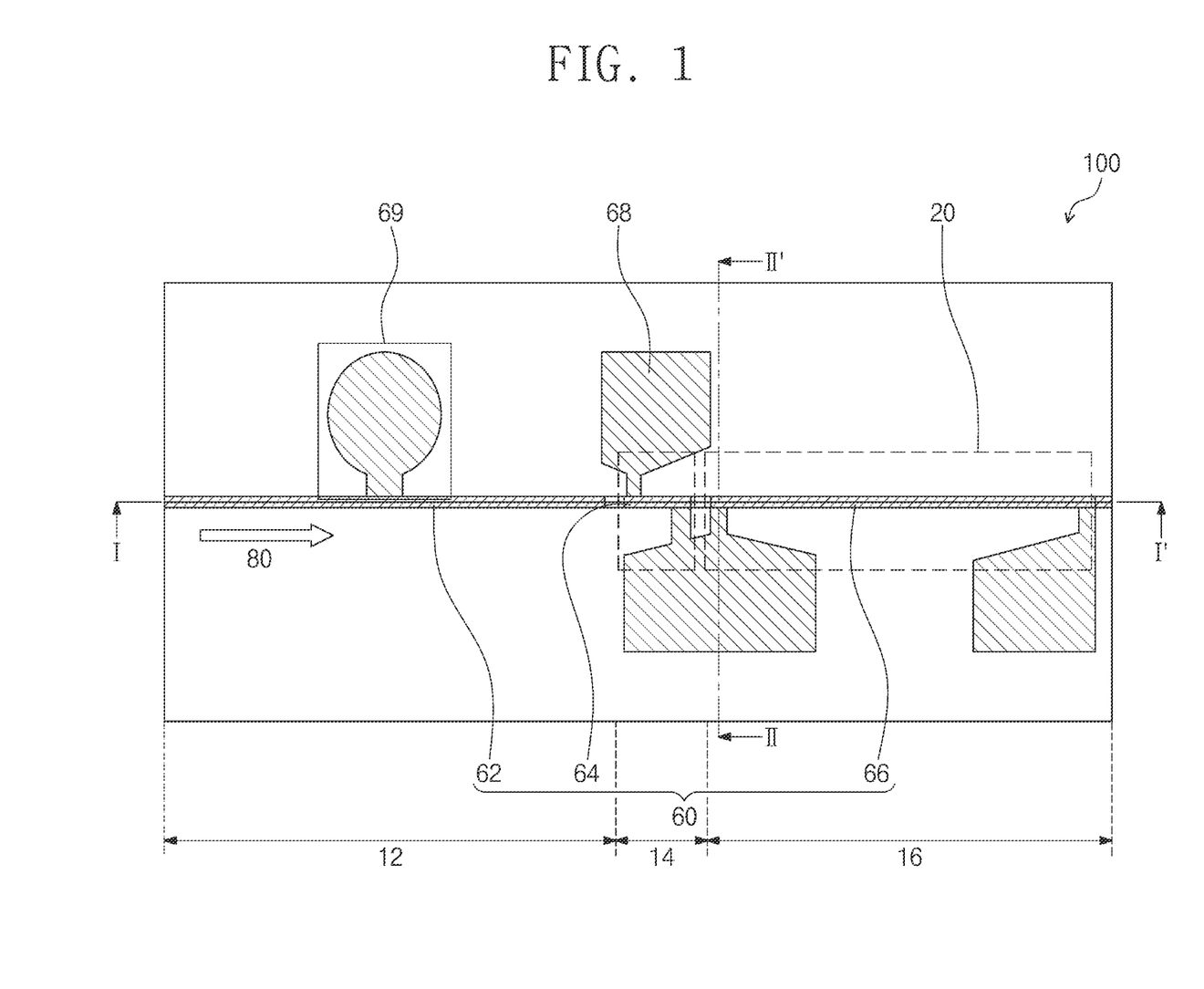
FIG. 1 is a plan view showing an example of a laser diode according to the inventive concept.
Figure 2:
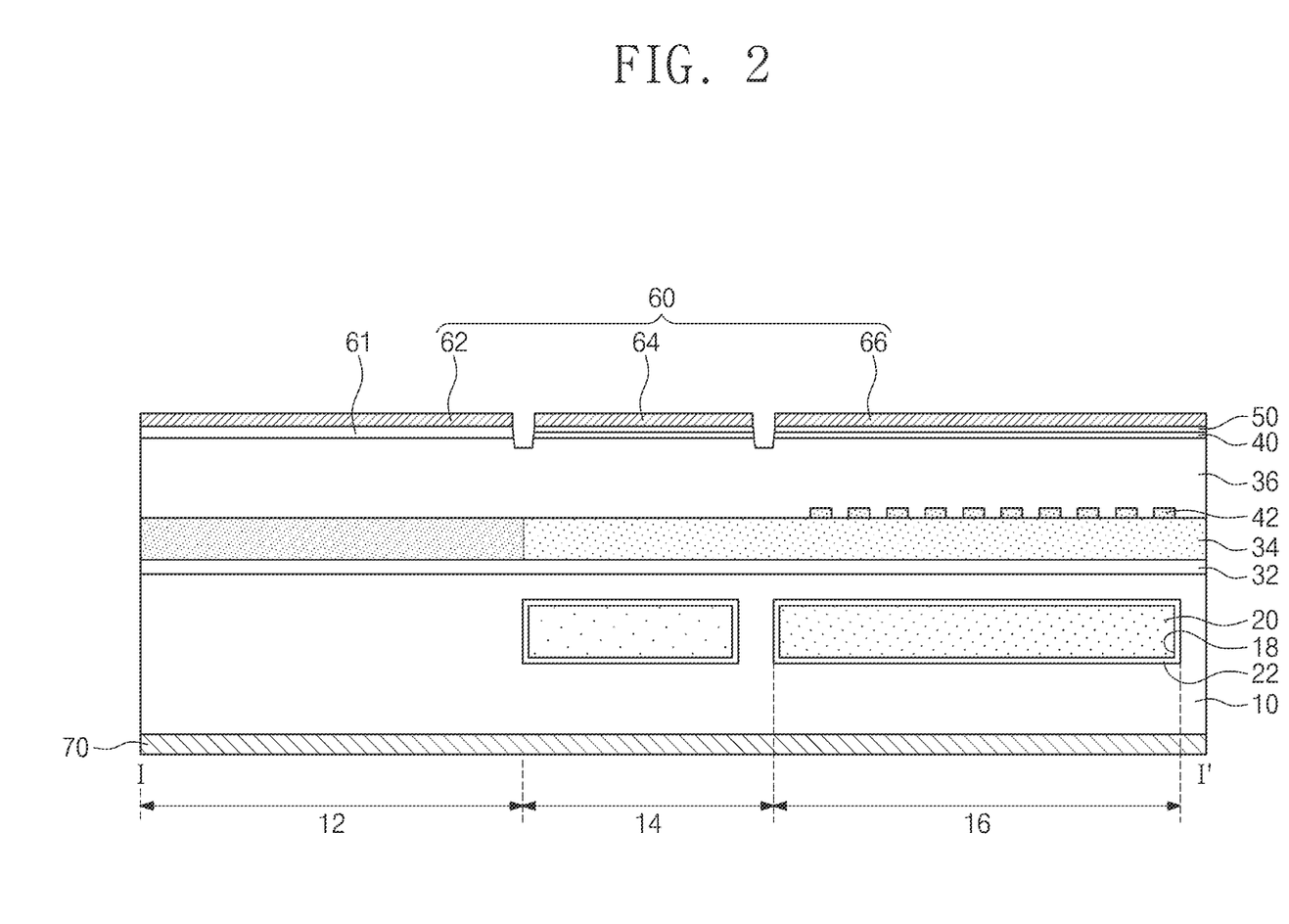
FIG. 2 and FIG. 3 are cross-sectional views taken along lines I-I' and II-II' of FIG. 1.
Figure 3:
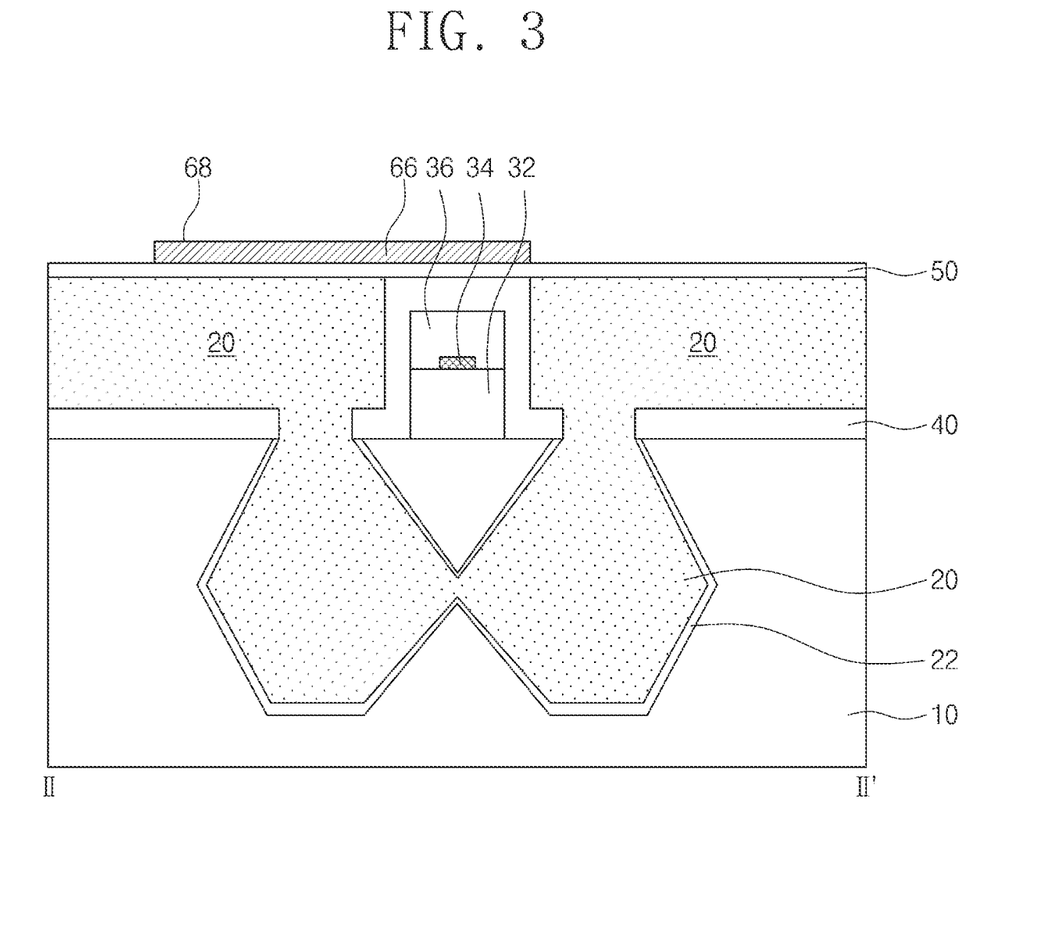

FIG. 1 shows an example of a laser diode 100 according to the inventive concept. FIG. 2 and FIG. 3 are views taken along lines I-I' and II-II' of FIG. 1.

Referring to FIG. 1 to FIG. 3, the laser diode 100 according to the inventive concept may be a distributed Bragg reflector laser diode. As an example, the laser diode 100 according to the inventive concept may include a substrate 10, a heat blocking layer 20, an optical waveguide 34, a lower insulation layer 40, an upper insulation layer 50, and upper electrodes 60.

The substrate 10 may provide a flat surface with respect to the optical waveguide 34. The substrate 10 may include III-V compound semiconductors of InP, GaAs, or GaN. Alternatively, the substrate 10 may include IV semiconductors of silicon or quartz, but the inventive concept is not limited thereto. As an example, the substrate 10 may include an active region 12, a phase shift region 14, and a DBR region 16. The active region 12, the phase shift region 14, and the DBR region 16 may be arranged in one direction. Among the above, the phase shift region 14 and the DBR region 16 may be have channel holes 18. The channel holes 18 may be provided in the substrate 10 of the phase shift region 14 and the DBR region 16.

The heat blocking layers 20 may be provided in the phase shift region 14 of the substrate 10 and the channel holes 18 of the DBR region 16. The heat blocking layers 20 may thermally separate the optical waveguide 34 from the substrate 10 of the phase shift region 14 and the DBR region 16. Specifically, the heat blocking layers 20 may block heat conduction and/or thermal conduction of the optical waveguide 34 on the substrate 10 to increase temperature uniformity of the optical waveguide 34. For example, each of the heat blocking layers 20 may have an M shape. The heat blocking layers 20 may include benzocyclbutene (BCB), or polyimide.

A barrier layer 22 may be provided between the heat blocking layers 20 and inner walls of the channel holes 18. The barrier layer 22 may include silicon oxide. Alternatively, the barrier layer 22 may include silicon nitride, but the inventive concept is not limited thereto.

A lower clad layer 32 may be provided on the substrate 10. The lower clad layer 32 may be a buffer layer provided on the entire surface of the substrate 10 of the active region 12, the phase shift region 14, and the DBR region 16. The lower clad layer 32 may have a refractive index equal to or higher than that of the substrate 10. For example, the lower clad layer 32 may include InP having a first conductivity (ex, n-type), but the inventive concept is not limited thereto.

The optical waveguide 34 may be provided on the lower clad layer 32. The optical waveguide 34 may have a width smaller than that of the lower clad layer 32. For example, the optical waveguide 34 may include a mesa optical waveguide. The optical waveguide 34 may have a refractive index higher than that of the lower clad layer 32. The optical waveguide 34 may include InGaAsP. As an example, the optical waveguide 34 may extend from the active region 12 to the DBR region 16 in one direction.

The optical waveguide 34 on the active region 12 may function as an active layer. The optical waveguide 34 on the active region 12 has a gain material, and may get a gain of laser light 80. The material may include InGaAsP and InGaAlAs. The optical waveguide 34 on the phase shift region 14 may shift the phase of the laser light 80. The optical waveguide 34 on the DBR region 16 may tune the wavelength of the laser light 80.

Although not illustrated in FIGS. 1 to 3, a total reflection layer and a half reflection layer may be provided on one sidewall of the optical waveguide 34 of the active region 12 and on the other sidewall of the optical waveguide 34 of the DBR region 16. The laser light 80 may be reflected between the total reflection layer and the half reflection layer. A portion of the laser light 80 may transmit the half reflection layer and be irradiated to the outside.

An upper clad layer 36 may be provided on the optical waveguide 34 and on the lower clad layer 32 outside the optical waveguide 34. The upper clad layer 36 may include InP having a second conductivity (ex, p-type). The upper clad layer 36 may have a refractive index lower than that of the optical waveguide 34. As an example, the upper clad layer 36 may have a Bragg grating 42 in the DBR region 16. Alternatively, the Bragg grating 42 may be provided in the lower clad layer 32 of the DBR region 16, but the inventive concept is not limited thereto. The Bragg grating 42 may reflect a portion of the laser light 80 to determine and/or control a wavelength interval of the laser light 80.

An ohmic electrode 61 may be provided on the upper clad layer 36 of the active region 12. The ohmic electrode 61 may reduce and/or minimize contact resistance between the upper clad layer 36 of the active region 12 and the upper electrode 60. For example, the ohmic electrode 61 may include gold (Au), but the inventive concept is not limited thereto.

The lower insulation layer 40 may be disposed on an upper surface of the upper clad layer 36 of the phase shift region 14 and the DBR region 16. The lower insulation layer 40 may include silicon nitride (SiNx). Alternatively, the lower insulation layer 40 may include silicon oxide (SiO$_2$), but the inventive concept is not limited thereto.

The heat blocking layers 20 may be provided on the lower insulation layer 40 of the lower clad layer 32 and the upper clad layer 36. Upper surfaces of the heat blocking layers 20 may be coplanar with an upper surface of the lower insulation layer 40 on the upper clad layer 36.

The upper insulation layer 50 may be provided on the heat blocking layer 20 and the lower insulation layer 40 of the phase shift region 14 and the DBR region 16. The upper insulation layer 50 may include the same material as the lower insulation layer 40. For example, the upper insulation layer 50 may include silicon nitride and/or silicon oxide.

The upper electrodes 60 may be provided on the ohmic electrode 61 and the upper insulation layer 50. The upper electrodes 60 may be aligned on the optical waveguide 34. The upper electrodes 60 may provide a current and/or an electric field to the optical waveguide 34 of the active region 12 to increase the intensity of the laser light 80. The upper electrodes 60 may heat the optical waveguide 34 of the phase shift region 14 to shift the phase of the laser light 80. In addition, the upper electrodes 60 may heat the optical waveguide 34 of the DBR region 16 to tune the wavelength of the laser light 80. As an example, the upper electrodes 60 may include a first electrode 62, a second electrode 64, and a third electrode 66. The first electrode 62, the second electrode 64, and the third electrode 66 may be electrically separated by grooves on upper surfaces of the upper clad layer 36 and the lower insulation layer 40.

Referring to FIG. 2, the first electrode 62 may be provided on the ohmic electrode 61 of the active region 12. The first electrode 62 may be used as a signal electrode. The first electrode 62 may provide a current to the optical waveguide 34 of the active region 12.

A lower electrode 70 may be provided on a lower surface of the substrate 10. When a bias voltage (now shown) is provided between the first electrode 62 and the lower electrode 70, currents may flow in the optical waveguide 34. If the currents flow in the optical waveguide 34, the intensity of the laser light 80 in the optical waveguide 34 may change. For example, the intensity of the laser light 80 may increase in proportional to the bias voltage.

The second electrode 64 may be provided on the upper insulation layer 50 of the optical waveguide 34 in the phase shift region 14. The second electrode 64 may be used as a heater electrode. The second electrode 64 may heat the optical waveguide 34 of the phase shift region 14 to tune the wavelength of the laser light 80 to be within 1 nm.

The third electrode 66 may be provided on the upper insulation layer 50 of the optical waveguide 34 in the DBR region 16. The third electrode 66 may be used as a heater electrode. The third electrode 66 may heat the optical waveguide 34 of the DBR region 16 to tune the wavelength of the laser light 80.

Electrode pads 68 may be provided on the upper insulation layer 50. The electrode pads 68 may be connected to each of the first electrode 62, the second electrode 64, and the third electrode 66. The electrode pad 68 of the first electrode 62 may be insulated from the substrate 10 by a pad insulation layer 69. For example, the pad insulation layer 69 may include benzocyclbutene (BCB), or polyimide.

The electrode pads 68 may be connected to both ends of the second electrode 64. In addition, the electrode pads 68 may be connected to both ends of the third electrode 66. The second electrode 64 and the third electrode 66 may be connected to each other though one of the electrode pads 68. That is, the electrode pad 68 which is connected to the second electrode 64 and the third electrode 66 may be a common electrode pad.

If the currents flow in the electrode pads 68 of the both ends of the third electrode 66, the third electrode 66 may heat the optical waveguide 34 to tune the wavelength of the laser light 80. The heat blocking layer 20 may block thermal conduction of the third electrode 66 to uniformly heat the optical waveguide 34. On the contrary, a typical laser diode may allow heat of the third electrode 66 to exit the substrate 10 without heat blocking of the heat blocking layer 20, so that wavelength tunable properties of the optical waveguide 34 may be deteriorated.

Figure 4:
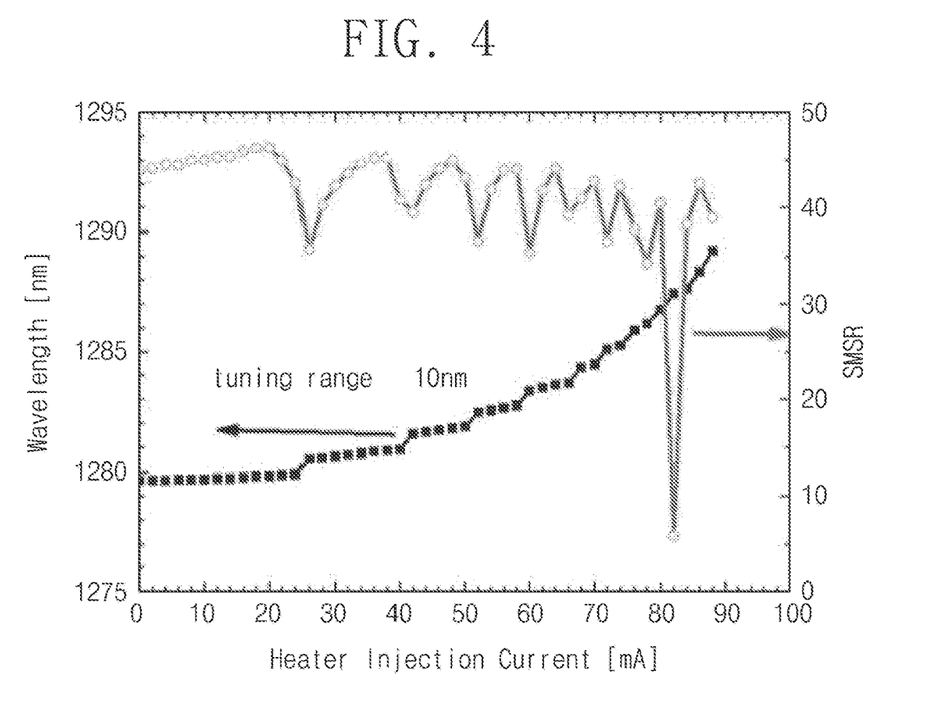
FIG. 4 are graphs showing tunable range of a wavelength of laser light and non-uniform SMSR of a typical laser diode.

FIG. 4 shows tuning range of a wavelength of a laser light and SMSR properties of a typical laser diode. In a typical laser diode, the heat of the heater electrode 66 may not be confined to the optical waveguide 34 and may leak to the substrate 10. The typical laser diode may have tuning range of the wavelength of about 10 nm.

Figure 5:
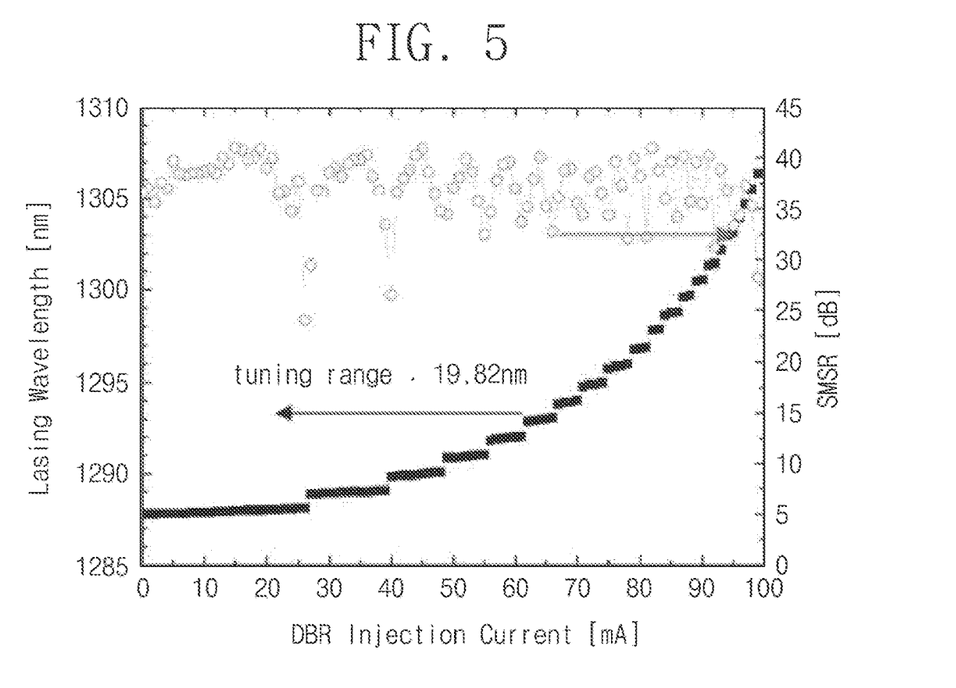
FIG. 5 are graphs showing tunable range of a wavelength of laser light and uniform SMSR of the laser diode according to the inventive concept of FIG. 1.

FIG. 5 shows tuning range of a wavelength of a laser light and SMSR properties of an embodiment of the inventive concept. In an embodiment of the inventive concept, the heat of the heater 66 may be confined to the optical waveguide 34. The laser diode 100 according to the inventive concept may have tuning range of the wavelength of about 20 nm.

Referring to FIG. 4 and FIG. 5, the laser diode 100 according to the inventive concept may have more excellent properties (ex, a wide tuning range) and a uniform side mode suppression ratio (SMSR) than a typical laser diode. For example, the laser diode 100 according to the inventive concept may have a wide tuning range of about 19.82 nm, and a typical laser diode may have a narrow tuning range of about 10 nm. In addition, the laser diode 100 according to the inventive concept may have a uniform SMSR of about 25 dB to about 35 dB, and the typical laser diode may have a non-uniform SMSR of about 5 dB to about 45 dB.

Figure 6:
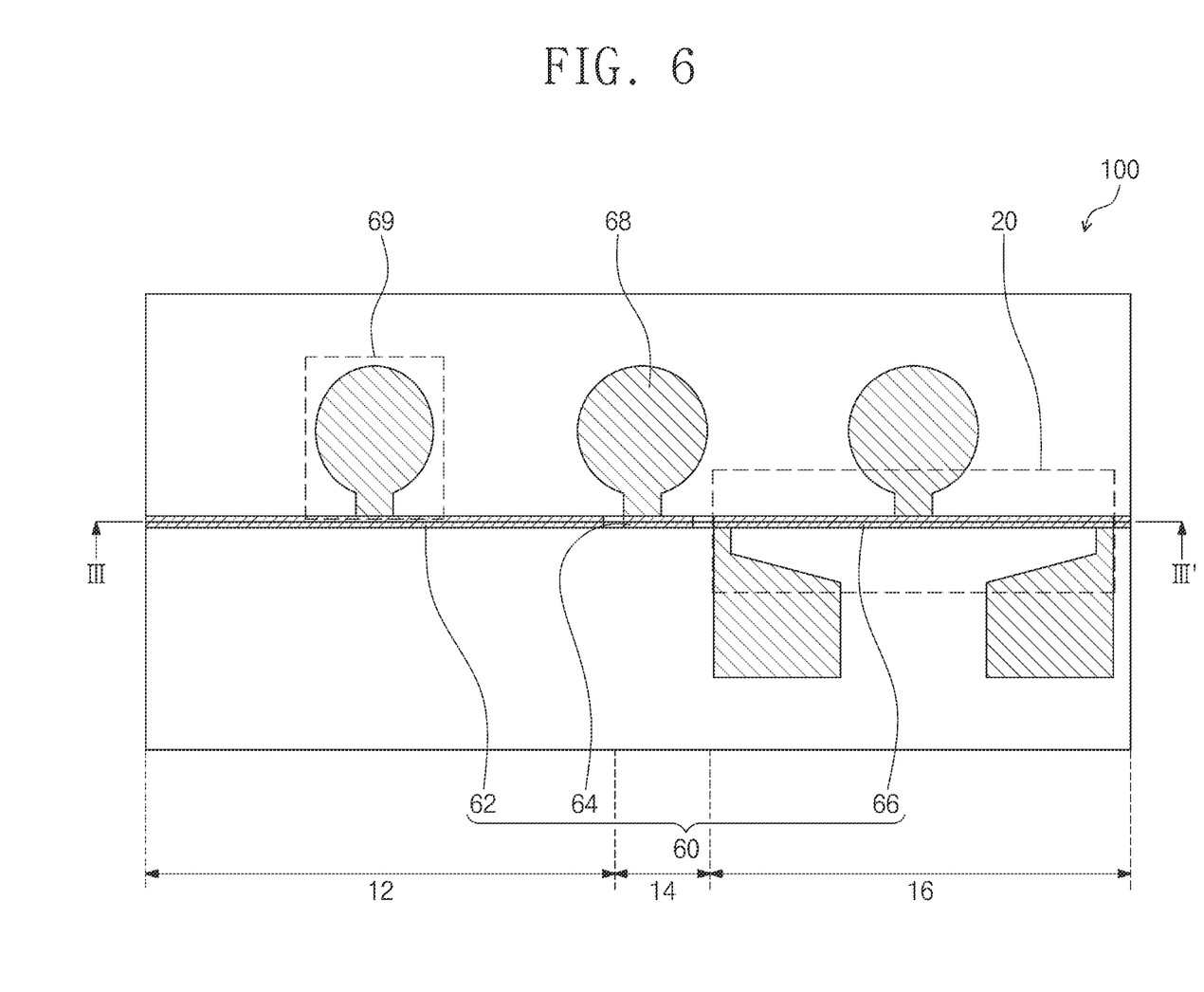
FIG. 6 is a plan view showing an example of a laser diode according to the inventive concept.
Figure 7:
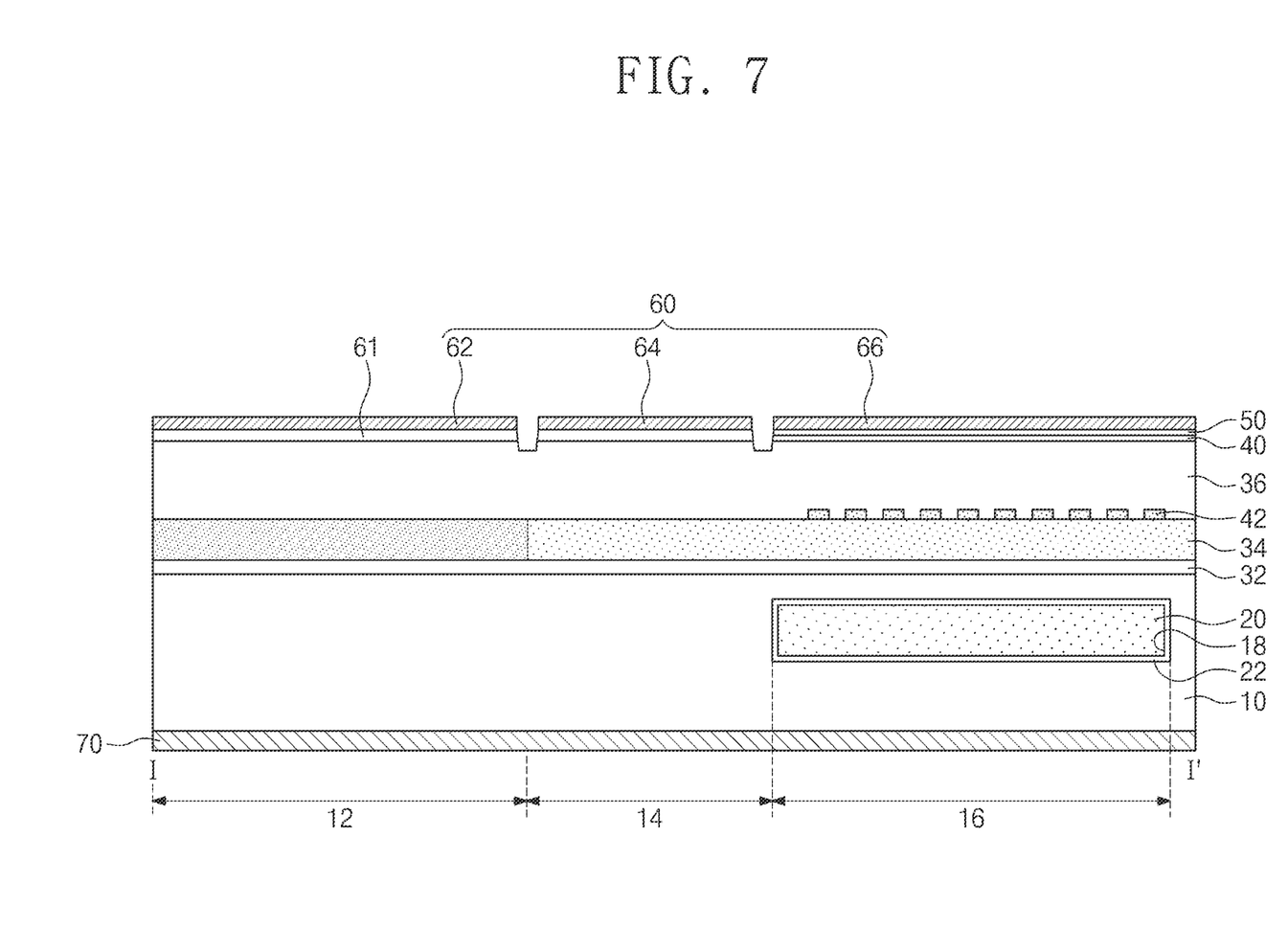
FIG. 7 is a cross-sectional view taken along line III-III' shown in FIG. 6.

FIG. 6 shows an example of a laser diode 100 according to the inventive concept. FIG. 7 is a view taken along line III-III' of FIG. 6.

Referring to FIG. 6 and FIG. 7, the second electrode 64 of the laser diode 100 according to the inventive concept may be used as a signal electrode without the heat blocking layer 20 in the phase shift region 14. When a bias voltage is provided between the second electrode 62 and the lower electrode 70, the second electrode 64 may provide a current to the optical waveguide 34 of the phase shift region 14. The ohmic electrode 61 may be provided between the second electrode 64 and the upper clad layer 36. The ohmic electrode 61 may reduce and/or minimize contact resistance between the second electrode 64 and the upper clad layer 36.

The substrate 10, the heat blocking layer 20, the lower clad layer 32, the optical waveguide 34, the upper insulation layer 36, the lower insulation layer 40, the upper insulation layer 50, the first electrode 62, and the third electrode 66 may be configured the same as shown in FIG. 1 and FIG. 2.

A method for manufacturing the laser diode 100 according to the inventive concept configured as above will be described as follows.

FIG. 8 to FIG. 12 are process cross-sectional views for the laser diode 100 according to the inventive concept.

Figure 8:
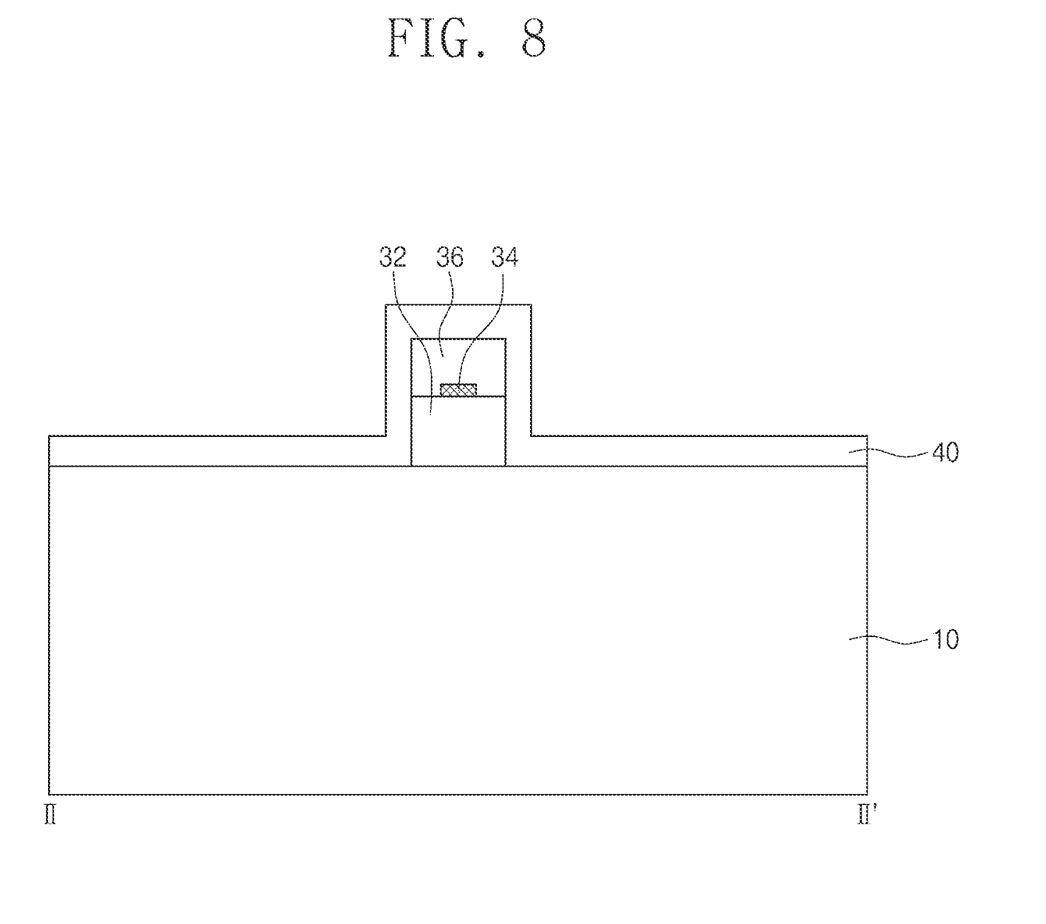
FIG. 8 to FIG. 12 are process cross-sectional views of a laser diode according to the inventive concept.

Referring to FIG. 8, a lower clad layer 32, an optical waveguide 34, and an upper clad layer 36 are formed on a substrate 10. For example, the lower clad layer 32, the optical waveguide 34, and the upper clad layer 36 may be formed on the substrate 10 through a wet etching method and a reactive ion etching (RIE) method. The substrate 10 may include a III-V compound semiconductor of InP, GaAs, or GaN.

Thereafter, a lower insulation layer 40 may be formed on the lower clad layer 32, the optical waveguide 34, the upper clad layer 36, and the substrate 10 of a phase shift region 14 and a DBR region 16. For example, the lower insulation layer 40 may include silicon nitride, or silicon oxide formed by chemical vapor deposition (CVD), but the inventive concept is not limited thereto.

Figure 9:
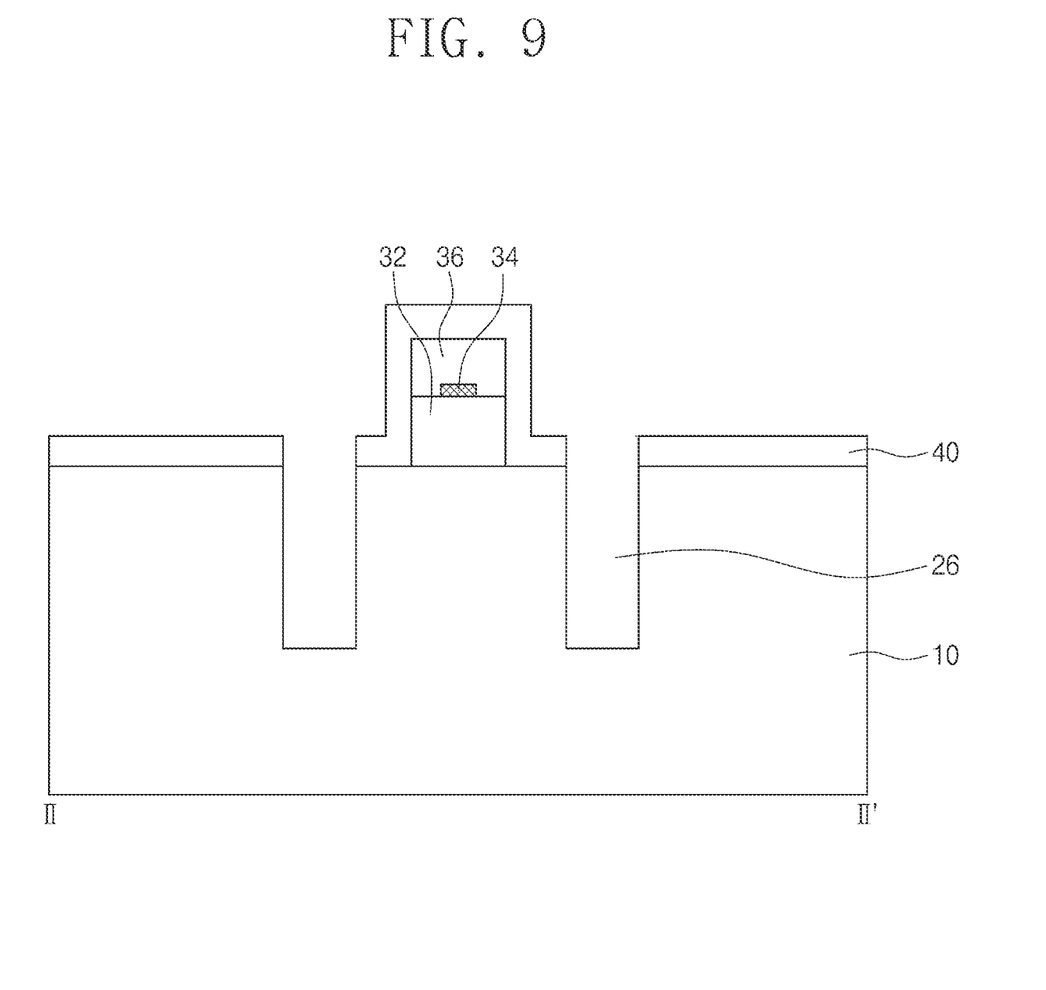

Referring to FIG. 9, by partially etching the lower insulation layer 40 and the substrate 10 outside the lower clad layer 32, the optical waveguide 34, and the upper clad layer 36, trenches 26 are formed. As an example, the trenches 26 may be formed by an anisotropic etching method. For example, the trenches 26 may be formed by a photolithography process, a dry etching process, and a wet etching process.

Figure 10:
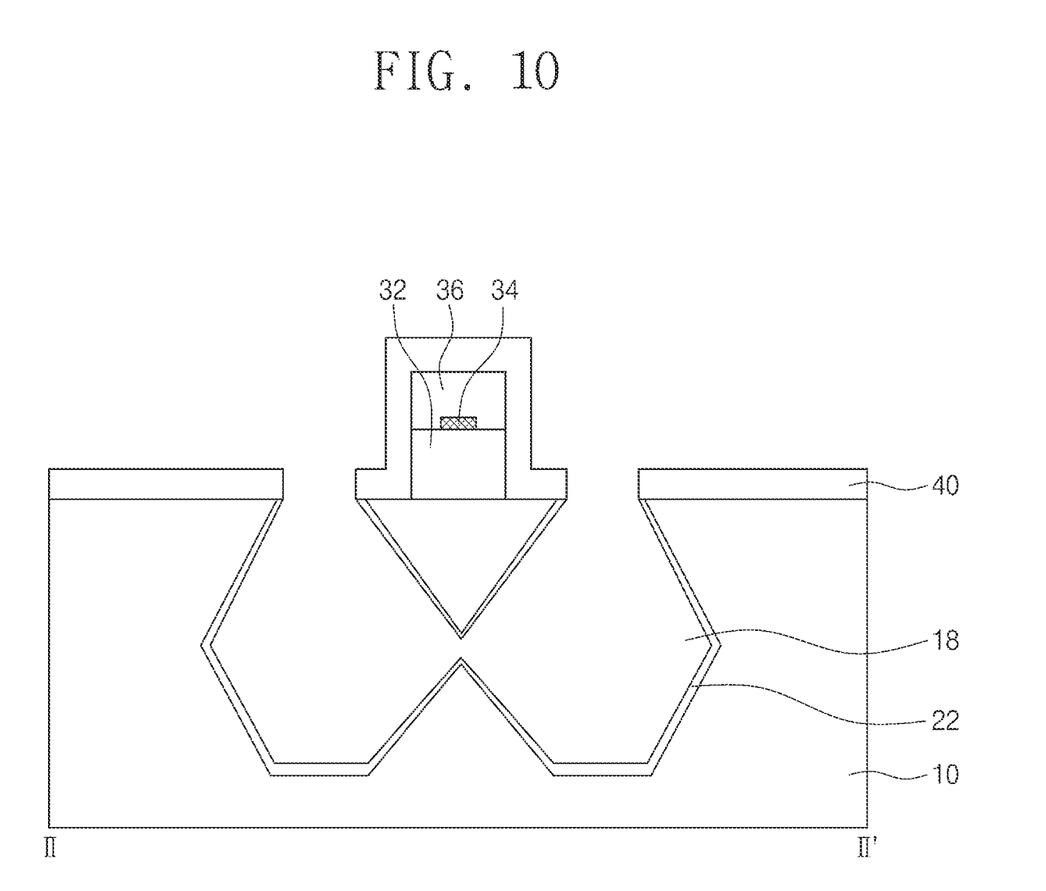

Referring to FIG. 10, the substrate 10 on inner walls of the trenches 26 may be selectively etched to form a channel hole 18. The channel hole 18 may connect between the trenches 26. The channel hole 18 may be formed by a selective etching method. For example, the channel hole 18 may be formed though a wet cleaning process using a solution capable of selectively etching the substrate 10 in the form of an inverse mesa.

Next, a barrier layer 22 is formed on a sidewall of the channel hole 18. The barrier layer 22 may include silicon nitride formed by an atomic layer deposition method, or a chemical vapor deposition method.

Figure 11:
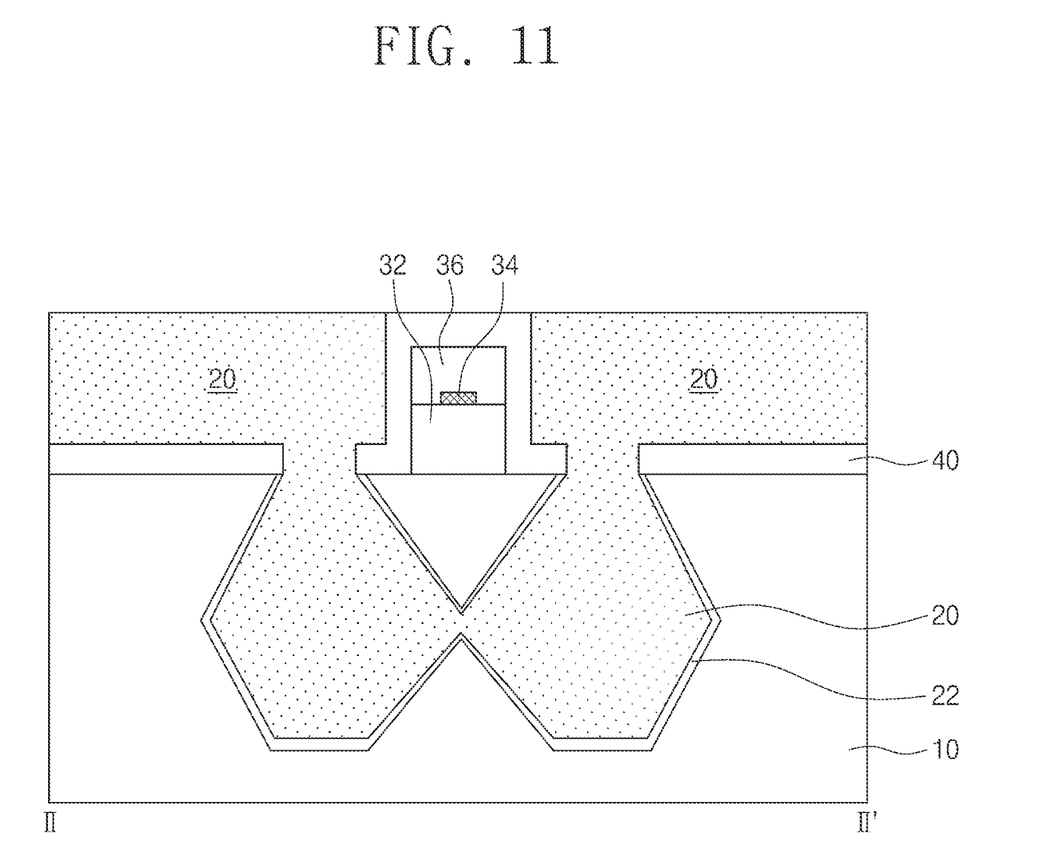

Referring to FIG. 11, a heat blocking layer 20 is formed inside the channel hole 18, and on the lower insulation layer 40 outside the lower clad layer 32, the optical waveguide 34, and the upper clad layer 36. The heat blocking layer 20 in the channel hole 18 may have an M shape. The heat blocking layer 20 may include benzocyclbutene (BCB), or polyimide. The heat blocking layer 20 may separate the optical waveguide 34 from the substrate 10 to reduce or minimize thermal conduction of the optical waveguide 34. The heat blocking layer 20 may locally expose the upper surface of the upper clad layer 36.

Figure 12:
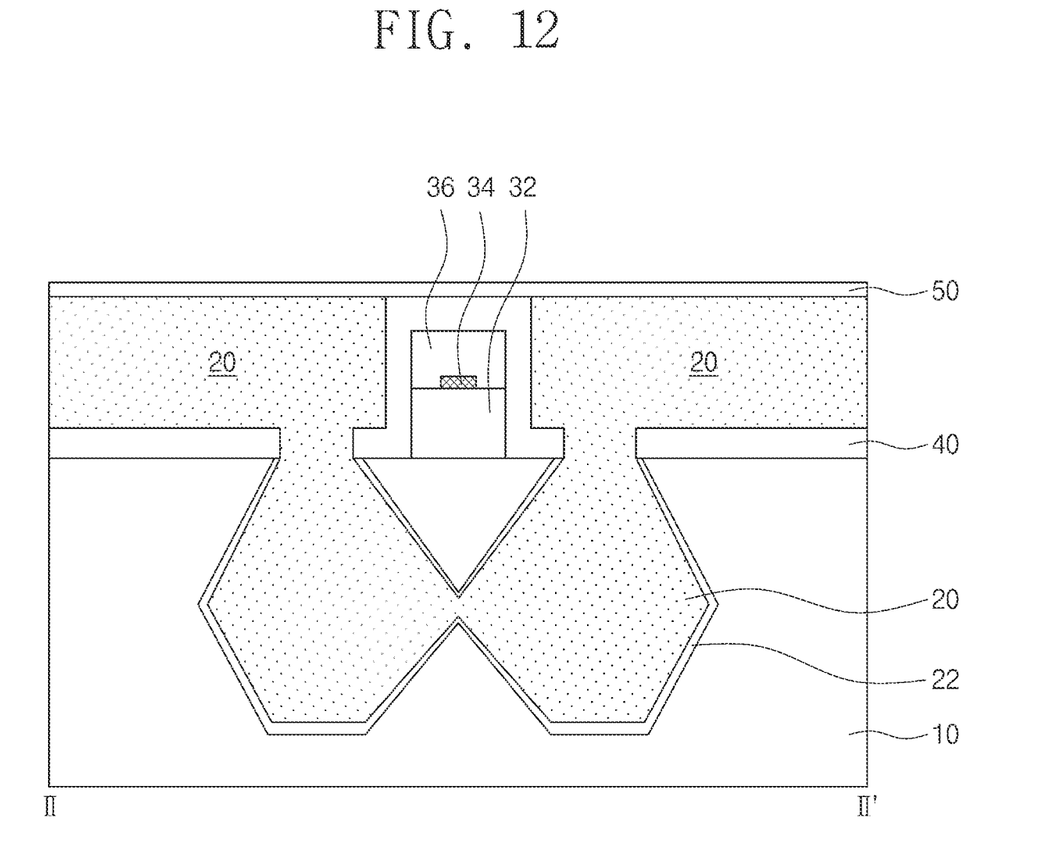

Referring to FIG. 12, an upper insulation layer 50 is formed on the heat blocking layer 20 and the lower insulation layer 40. The upper insulation layer 50 may include the same material as the lower insulation layer 40. The upper insulation layer 50 may include silicon nitride and/or silicon oxide. Although not illustrated in FIG. 12, the lower insulation layer 40 and the upper insulation layer 50 on the upper clad layer 36 of the active region 12 may be removed by a photolithography process and an etching process.

Thereafter, an ohmic electrode 61 may be formed on the upper clad layer 36 of the active region 12.

Referring to FIG. 3, upper electrodes 60 are formed on the ohmic electrode 61 and the upper insulation layer 50. The upper electrodes 60 may include a metal formed through a sputtering process, a photolithography process, and an e-beam deposition process. As an example, the upper electrodes 60 may include a first electrode 62, a second electrode 64, and a third electrode 66. The first electrode 62 may be formed on the upper clad layer 36 in the active region 12. For example, the first electrode 62 may be formed as a multilayer of Ti/PT/Au. The second electrode 64 and the third electrode 66 may be respectively formed on the upper insulation layer 50 of the phase shift region 14 and the DBR region 16. Each of the second electrode 64 and the third electrode 66 may be formed as a multilayer of Ti/PT/Au. Electrode pads 68 may be formed simultaneously with the upper electrodes 60. The electrode pads 68 may be formed on the upper insulation layer 50. The electrode pads 68 may be connected to the upper electrodes 60.

Referring to FIG. 2, a lower electrode 70 is formed on a lower surface of the substrate 10 of the active region 12. The lower electrode 70 may be formed by an etching process and an e-beam process.

As described above, a laser diode according to the inventive concept uses a heat blocking layer in a channel hole of a substrate to thermally separate an optical waveguide from the substrate, and thus, may uniformly control the temperature of a DBR region.

The above-described contents are specific examples for practicing the inventive concept. The inventive concept will include not only the embodiments described above, but also embodiments which may be simply designed or easily changed from the embodiments. In addition, the inventive concept will also include techniques which may be easily modified and implemented in the future using the above-described embodiments.

What is claimed is:

1. A laser diode comprising:
a substrate including an active region, a phase shift region adjacent to the active region, and a DBR region adjacent to the phase shift region and having a channel hole;
a lower clad layer disposed on the substrate;
an optical waveguide disposed on the lower clad layer and extending from the active region to the DBR region;
an upper clad layer disposed on the optical waveguide and the lower clad layer;
a lower insulation layer disposed on the lower clad layer, the upper clad layer, and the substrate of the phase shift region and the DBR region;
an upper insulation layer disposed on the lower insulation layer;
upper electrodes disposed on the upper insulation layer; and
a heat blocking layer disposed between the upper insulation layer and the lower insulation layer outside the lower clad layer, the optical waveguide, and the upper clad layer, the heat blocking layer disposed in the channel hole to thermally separate the optical waveguide from the substrate.

2. The laser diode of claim 1, wherein the heat blocking layer comprises benzocyclbutene (BCB), or polyimide.

3. The laser diode of claim 1, wherein the heat blocking layer has an M shape.

4. The laser diode of claim 1, wherein the heat blocking layer is disposed on both sidewalls and a lower portion of the optical waveguide.

5. The laser diode of claim 1, wherein the upper clad layer comprises a Bragg grating disposed in the DBR region.

6. The laser diode of claim 1, wherein the lower insulation layer and the upper insulation layer comprise silicon nitride.

7. The laser diode of claim 1, further comprising:
an ohmic electrode provided between the upper clad layer of the active region and one of the upper electrodes; and
electrode pads connected to the upper electrodes.

8. The laser diode of claim 7, further comprising a pad insulation layer between one of the electrode pads of the active region and the substrate,
wherein the pad insulation layer includes benzocyclbutene (BCB), or polyimide.

9. The laser diode of claim 1, further comprising a barrier layer between an inner wall of the channel hole and the heat blocking layer.

10. The laser diode of claim 1, further comprising a lower electrode disposed on a lower surface of the substrate of the active region.

11. A method for manufacturing a laser diode, the method comprising:
- forming a lower clad layer, an optical waveguide, and an upper clad layer on a substrate including an active region, a phase shift region, and a DBR region;
- forming a lower insulation layer on the lower clad layer, the optical waveguide, the upper clad layer, and the substrate of the DBR region;
- partially etching the lower insulation layer and the substrate outside the lower clad layer, the optical waveguide, and the upper clad layer of the phase shift region and the DBR region to form trenches;
- etching the substrate on inner walls of the trenches to form a channel hole connecting the trenches;
- forming a heat blocking layer inside of the channel hole and on the lower insulation layer;
- forming an upper insulation layer on the heat blocking layer and on the lower insulation layer; and
- forming upper electrodes on the upper insulation layer of the phase shift region and the DBR region, and on the upper clad layer of the active region.

12. The method of claim 11, further comprising forming a contact electrode on the upper clad layer of the active region.

13. The method of claim 11, further comprising forming a barrier layer on an inner wall of the channel hole.

14. The method of claim 11, wherein the trenches are formed by a dry etching process.

15. The method of claim 11, wherein the channel hole is formed by a wet etching process.

* * * * *